United States Patent
Knörr et al.

(10) Patent No.: US 9,554,458 B2
(45) Date of Patent: Jan. 24, 2017

(54) MOUNTING CARRIER AND METHOD OF MOUNTING A MOUNTING CARRIER ON A CONNECTING CARRIER

(71) Applicant: OSRAM Opto Semiconductors GmbH, Regensburg (DE)

(72) Inventors: Matthias Knörr, Tanjung Tokong (MY); Herbert Brunner, Sinzing (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/405,823

(22) PCT Filed: Jun. 12, 2013

(86) PCT No.: PCT/EP2013/062168
§ 371 (c)(1),
(2) Date: Dec. 5, 2014

(87) PCT Pub. No.: WO2013/186267
PCT Pub. Date: Dec. 19, 2013

(65) Prior Publication Data
US 2015/0327360 A1    Nov. 12, 2015

(30) Foreign Application Priority Data
Jun. 13, 2012    (DE) .................. 10 2012 105 110

(51) Int. Cl.
*B23K 31/02*    (2006.01)
*H05K 1/02*    (2006.01)
(Continued)

(52) U.S. Cl.
CPC ............. *H05K 1/0271* (2013.01); *B23K 1/008* (2013.01); *B23K 1/0016* (2013.01); *B23K 1/08* (2013.01);
(Continued)

(58) Field of Classification Search
None
See application file for complete search history.

(56) References Cited

U.S. PATENT DOCUMENTS 5,041,902 A * 8/1991 McShane ............. H01L 23/367
257/706
6,118,656 A * 9/2000 Wang ..................... F28F 3/02
257/E23.103

(Continued)

FOREIGN PATENT DOCUMENTS

DE    101 58 754 A1    6/2003
DE    103 37 640 A1    3/2005
(Continued)

OTHER PUBLICATIONS

"Amkor Introduces Advanced Copper Pillar Bump & Packaging Technologies," Amkor Advertisement, www.amkor.com, Amkor Technology, Inc., 1900 South Price Road, Chandler, AZ 85286, USA.

(Continued)

*Primary Examiner* — Kiley Stoner
(74) *Attorney, Agent, or Firm* — DLA Piper LLP (US)

(57) ABSTRACT

A mounting carrier for semiconductor chips includes a second main surface provided for mounting of semiconductor chips, and a first main surface opposite to the second main surface. The mounting carrier also includes a mounting body, wherein the mounting body includes a first metallization on the side facing the first main surface and the first main surface includes a structure having a plurality of columnar structural elements.

17 Claims, 8 Drawing Sheets

(51) Int. Cl.
*B23K 1/00* (2006.01)
*B23K 1/08* (2006.01)
*B23K 1/008* (2006.01)
*H05K 1/18* (2006.01)
*H01L 23/498* (2006.01)
*H01L 23/373* (2006.01)

(52) U.S. Cl.
CPC ......... *H01L 23/49811* (2013.01); *H05K 1/181* (2013.01); *H01L 23/3735* (2013.01); *H01L 2924/0002* (2013.01)

(56) References Cited

U.S. PATENT DOCUMENTS

| | | | | |
|---|---|---|---|---|
| 6,218,629 | B1* | 4/2001 | Brofman | H01L 24/83 174/257 |
| 6,317,326 | B1* | 11/2001 | Vogel | H01L 23/473 165/80.4 |
| 6,613,606 | B1* | 9/2003 | Lee | H01L 21/563 257/E21.503 |
| 8,643,171 | B1* | 2/2014 | Nakazato | H01L 23/34 165/80.3 |
| 2001/0020545 | A1* | 9/2001 | Eldridge | B23K 20/004 174/260 |
| 2002/0159237 | A1* | 10/2002 | Patel | H01L 23/3675 361/719 |
| 2002/0180034 | A1* | 12/2002 | Winkel | H01L 23/4093 257/706 |
| 2002/0190107 | A1* | 12/2002 | Shah | B23K 35/0222 228/180.22 |
| 2003/0226253 | A1* | 12/2003 | Mayer | B23K 1/0016 29/832 |
| 2005/0106902 | A1* | 5/2005 | Hougham | H01L 23/49827 439/66 |
| 2007/0035008 | A1* | 2/2007 | Wu | H01L 23/3107 257/700 |
| 2007/0120268 | A1 | 5/2007 | Irsigler et al. | |
| 2009/0243089 | A1 | 10/2009 | Hohlfeld et al. | |
| 2009/0250806 | A1* | 10/2009 | Wang | H01L 23/3675 257/712 |
| 2009/0294938 | A1* | 12/2009 | Chen | H01L 21/563 257/676 |
| 2010/0091461 | A1* | 4/2010 | Yamanaka | H01L 23/3675 361/709 |
| 2011/0031610 | A1* | 2/2011 | Yamazaki | H01L 23/4985 257/693 |
| 2011/0031612 | A1* | 2/2011 | Mitsui | H01L 23/3107 257/713 |
| 2011/0038122 | A1* | 2/2011 | Ahangar | H01L 23/4275 361/700 |
| 2011/0233756 | A1* | 9/2011 | Khandekar | H01L 23/3737 257/712 |
| 2012/0168206 | A1* | 7/2012 | Sekine | H01L 21/486 174/252 |
| 2012/0262883 | A1 | 10/2012 | Iwata et al. | |
| 2013/0199770 | A1* | 8/2013 | Cherian | F28F 3/00 165/185 |

FOREIGN PATENT DOCUMENTS

| | | | | |
|---|---|---|---|---|
| DE | 102009044086 A1 | * | 3/2011 | ......... H01L 23/3677 |
| DE | 10 2010 029 5 | | 12/2011 | |
| EP | 0675538 A2 | * | 10/1995 | ......... H01L 23/3677 |
| JP | 1-165147 A | | 6/1989 | |
| JP | EP 2487710 A1 | * | 8/2012 | ......... H01L 21/565 |
| WO | 2012/157584 A1 | | 11/2012 | |

OTHER PUBLICATIONS

"Fine Pitch Copper Pillar Flip Chip," Amkor Datasheet, www.amkor.com, Amkor Technology, Inc., 1900 South Price Road, Chandler, AZ 85286, USA.

"Flip Chip Packaging," Amkor Datasheet, www.amkor.com, Amkor Technology, Inc., 1900 South Price Road, Chandler, AZ 85286, USA.

Minjae Lee et al., "Study of Interconnection Process for Fine Pitch Flip Chip," Electronic Components and Technology Conference (ECTC), San Diego, CA, USA, May 26-29, 2009, pp. 720-723.

Ahmer Syed et al., "Flip Chip Bump Electromigration Reliability: A comparison of Cu Pillar, High Pb, SnAg, and SnPb Bump Structures," IMAPS Device Packaging Conference 2010, Scottsdale/Fountain Hills, Arizona, USA, Mar. 9-11, 2010, pp. 000166-000171.

Ahmer Syed et al., "Factors Affecting Electromigration and Current Carrying Capacity of FC and 3D IC Interconnects," 12th Electronic Packaging and Technology Conference 2010, Singapore, Dec. 8-11, 2010, pp. 538-544.

* cited by examiner

MOUNTING CARRIER AND METHOD OF MOUNTING A MOUNTING CARRIER ON A CONNECTING CARRIER

TECHNICAL FIELD

This disclosure relates to a mounting carrier for semiconductor chips and to a method of mounting a mounting carrier on a connecting carrier.

BACKGROUND

Conventional methods of producing a connection between a mounting carrier and a connecting carrier include adhesion by an elastic adhesive and soldering, over a large surface by a solder material consisting of metal.

By reason of the difference in the coefficient of thermal expansion between the mounting carrier and the connecting carrier, thermomechanical stresses can occur in the event of fluctuations in temperature. In particular, in solder connections over a large area, these stresses can cause damage to the solder connection and as a result the required service life of the solder connection may not be achieved. Compared to a solder connection, a more elastic adhesive connection can more effectively compensate for the thermomechanical stresses, but has a considerably lower thermal conductivity.

It could therefore be helpful to provide a mounting carrier and a mounting method to produce a highly stable and at the same time highly thermally conductive connection between a mounting carrier and a connecting carrier.

SUMMARY

We provide a mounting carrier including a second main surface provided for mounting of semiconductor chips, a first main surface opposite the second main surface, and a mounting body including a first metallization on a side facing the first main surface, wherein the first main surface includes a structure having a plurality of columnar structural elements.

We also provide a method of mounting the mounting carrier including a second main surface provided for mounting of semiconductor chips, a first main surface opposite the second main surface, and a mounting body including a first metallization on a side facing the first main surface, wherein the first main surface includes a structure having a plurality of columnar structural elements, on a connecting carrier, including providing the mounting carrier, forming a solder material between the mounting carrier and the connecting carrier, temporarily fixing the position of the mounting carrier on the connecting carrier, and producing a solder connection between the structure and the connecting carrier.

We further provide a mounting carrier including a second main surface provided for mounting of semiconductor chips, a first main surface opposite to the second main surface, and a mounting body including a first metallization on a side facing the first main surface, wherein a first main surface includes a structure having a plurality of columnar structural elements, and from an inner region towards edges of the first metallization the columnar structural elements include cross-sectional surfaces which decrease in size.

DETAILED DESCRIPTION

Figure 1A:
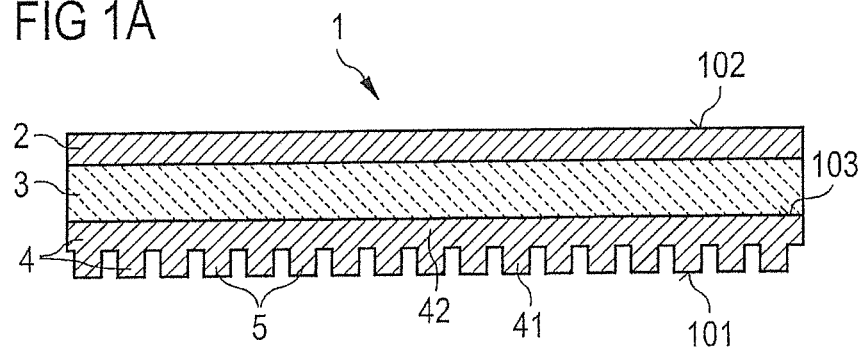
FIG. 1A shows an example of a mounting carrier in a schematic sectional view.

Our mounting carriers comprise a second main surface to mount semiconductor chips, and a first main surface opposite to the second main surface. The mounting carrier also comprises a mounting body, wherein the mounting body comprises a first metallization on the side facing the first main surface and the first main surface comprises a structure having a plurality of columnar structural elements.

When producing a connection between the structure of the mounting carrier and a connecting carrier, e.g., by a connection layer, the connection is effectively divided into many connection points by reason of the columnar structure. As a result, the thermomechanical stresses which occur in the event of fluctuations in temperature can be more effectively compensated for. Compared to a continuous connection over a large area, a considerable reduction in the maximum occurring thermomechanical stresses is achieved. Moreover, division of the connection of the mounting carrier to the connecting carrier into many connection points slows down crack growth.

The mounting carrier extends preferably in a vertical direction between the first and second main surfaces. The first metallization is preferably formed on the side of the mounting body facing the first main surface.

In particular, the mounting body can comprise a boundary surface on the side facing the first metallization. The first metallization can directly adjoin the boundary surface. The boundary surface can be flat or can comprise elevations or recesses.

The first metallization can be formed in a single layer or in multiple layers. In particular, it can be formed in one piece. Furthermore, the first metallization or at least a partial layer of the first metallization can contain or consist of copper. Copper is characterized in particular by high thermal conductivity. As an alternative or in addition to copper, the first metallization can contain further materials, e.g., a metallic alloy which can contain in particular copper. It is also preferable that the first metallization is adapted to the connecting carrier in terms of the coefficient of thermal expansion. The risk of fracture of a connection produced, e.g., by soldering, between the first metallization and the connecting carrier is thus reduced.

A columnar structural element is understood to be an element which comprises a cross-section, which is extended in parallel with the second main surface, and a height which is directed vertically with respect to the second main surface. The border of the cross-section can assume any shape, e.g., curved, for instance circular or oval, or polygonal, for instance rectangular, in particular square, or hexagonal. Preferably, the columnar structural elements can be used in parallel with different cross-sectional shapes or with different cross-sectional surfaces. For example, at least two structural elements comprise mutually different cross-sections, in particular with regard to the cross-sectional shape and/or the cross-sectional surface. Along the direction of the height, the cross-section of the individual structural element preferably remains substantially constant. "Substantially constant" means that the shape of the cross-section preferably does not change and the ratio of the minimum cross-section to the maximum cross-section of the structural element is 0.5 to 1, particularly preferably 0.9 to 1.

The aspect ratio of the height to the maximum extension of the cross-section is configured such that the columnar structural elements have sufficient mechanical stability during production, during mounting and in use. The aspect ratio is 0.01 to 20, preferably 0.1 to 10 and particularly preferably 0.25 to 5.

The columnar structural elements preferably form the structure of the mounting carrier. Preferably, they are applied in a structured manner onto the boundary surface or are formed by structuring exclusively the first metallization. A further possible way of forming the structural elements is to structure the first metallization and the mounting body. In this case, the structural elements thus comprise a part of the mounting body and a part of the first metallization. Moreover, the structural elements can be formed by applying the first metallization onto an already structured mounting body.

In a flat boundary surface between the mounting body and the first metallization, each columnar structural element is exclusively part of the first metallization.

The structural elements can be arranged directly on the mounting body. The intermediate spaces between the structural elements can thus extend completely through the first metallization. Alternatively, a structural base can be formed between the structural elements and the mounting body. The structural base can completely cover the mounting body. In an expedient manner, the structural base is likewise part of the first metallization. The intermediate spaces between the structural elements extend in this case in a vertical direction to the structural base. When a voltage is applied, the structural base and all of the structural elements electrically connect to one another.

In addition to the structural elements, the structural base can also absorb the thermomechanical stresses between the mounting carrier and the connecting carrier which occur in the event of fluctuations in temperature. Moreover, a cross-sectional surface of the structural base can be larger than the sum of the cross-sectional surfaces of the structural elements. The connection surface to the mounting body is thus enlarged which results in a particularly stable connection between the metallization and the mounting body.

Moreover, the boundary surface can comprise elevations or recesses. For example, the mounting carrier is structured such that the boundary surface likewise comprises a columnar structure. In contrast to a flat boundary surface, the structural elements can be part of the metallization and also part of the mounting carrier. The first metallization can be a thin metal layer arranged on the apexes of the elevations of the boundary surface. It is also possible that the first metallization completely covers the elevations and preferably also the recesses. By reason of the enlarged adhesive surface, the latter example comprises a highly stable connection between the first metallization and the mounting body and a uniform heat distribution on the surface of the structural elements formed by the complete coverage.

Preferably, the mounting body contains a ceramic, in particular an AlN ceramic or an aluminium oxide ceramic. Ceramic has a very good thermal conductivity and a comparatively low coefficient of thermal expansion and is particularly suitable for efficient heat dissipation.

Further preferably, the structural elements have a height of 30 micrometers to 300 micrometers.

It is also preferable that the structural elements are substantially the same height. Dimensions are considered to be "substantially the same" if they are equal within manufacturing tolerances. The fact that all of the structural elements are the same height simplifies formation of a flat connection plane between the connecting carrier and the structural elements. In particular, all of the connection points can be located on the connection plane and can thus be formed with the same level of stability where possible. Preferably, the connection plane is in parallel with the second main surface.

It is also preferable that the cross-section of a structural element has a maximum extension of 20 micrometers to 3000 micrometers.

The cross-sections of the structural elements can comprise fundamentally different extensions and different shapes. Preferably, the structural elements are identical in terms of their basic shape and more preferably in terms of their cross-section. Particularly preferably, the cross-sections are circular and more preferably substantially identical. By reason of the point symmetry, structural elements having a circular cross-section can be produced without significant outlay. Circular cross-sections also permit efficient application of a further material layer, e.g., a solder layer, onto the structural elements.

Further preferably, the entire surface of all cross-sectional surfaces of the structural elements constitutes 25% to 80% of the entire surface of the second main surface. This means that in a top view, that is to say in a perpendicular projection view onto the second main surface, the structural elements cover 25% to 80% of the entire surface of the second main surface. Preferably, the entire surface of the first main surface, that of the boundary surface and that of the second main surface are identical or substantially identical in a projection view.

Further preferably, the structural elements are arranged at an identical distance from one another. When mounting the mounting carrier on a connecting carrier, uniform distribution of the connection points is achieved in a simplified manner, which has a positive effect in terms of compensating for the thermomechanical stresses and the uniform temperature distribution.

Further preferably, at least two structural elements comprise mutually different cross-sections. Preferably, the mutually different cross-sections comprise different shapes and/or different surfaces. For example, the surfaces of the cross-sections of the structural elements at the edge of the first metallization are smaller than the surfaces of the cross-sections of the structural elements in an inner region of the metallization. Such a distribution of the structural elements having different cross-sections increases the stability of the connection between the mounting carrier and the connecting carrier, in particular with respect to considerable fluctuations in temperature.

Preferably, the structural elements are covered by a first solder layer. Preferably, the first solder layer contains Sn, Ag or Cu, or a metallic alloy having at least one of the aforementioned materials, in particular SnAgCu.

It is also preferable that the first solder layer is formed such that it forms on each structural element a dome shape, the height of which is less than the minimum distance from the structural element bearing this dome shape to its adjacent structural elements. With such a configuration, it is possible, e.g., to avoid unnecessary enlargement of the connection points between the structural elements and the connecting carrier.

Further preferably, the mounting body comprises a second metallization on the side facing the second main surface. With the second metallization, it is possible to achieve a homogeneous temperature distribution on its surface and thereby achieve an effective heat dissipation into the mounting body. The second metallization preferably contains copper. Furthermore, the first metallization and the second metallization can be formed in a similar manner in terms of material.

It is also preferable that at least one or a plurality of semiconductor chips are arranged on the second main surface. The semiconductor chip is connected to the second metallization preferably by an adhesive layer or a solder layer or a sinter layer.

In one example of a method of mounting a mounting carrier on a connecting carrier, the mounting carrier is provided, e.g., on a gripper arm. A solder material is formed between the mounting carrier and the connecting carrier. The position of the mounting carrier is fixed temporarily. A solder connection is produced between the structure and the connecting carrier.

In particular, a mounting carrier as described above is suitable for the method. Therefore, features described in connection with the mounting carrier can also be used for the method, or vice versa.

Preferably, a solder material, e.g., SnAgCu, is formed between the mounting carrier and the connecting carrier. The solder material forms a first solder layer directly on the columnar structural elements and/or forms a second solder layer directly on the connecting carrier.

It is also preferable that forming the solder material comprises immersing the structure into a reservoir filled with the solder material. The solder material thereby adheres to the apexes of the columnar structural elements and thus forms the first solder layer. The first solder layer can thus be simultaneously formed on all of the structural elements. Moreover, the first solder layer is thereby distributed in a particularly uniform manner in terms of quantity, which has a positive effect upon formation of the most equally stable connection points possible between the structure and the connecting carrier.

It is also preferable that forming the solder material comprises a coating step of forming the second solder layer, in which the connecting carrier is coated with the solder material. Preferably, the connecting carrier is coated with the solder material at least partially, in particular on the connection points provided for the solder connection. However, the connecting carrier can also be coated with the solder material over a large area, whereby a connection layer over a large area is formed during mounting. This can prove to be favorable in terms of compensating for the thermomechanical stresses, in particular in a soft solder, because the solder material can effectively absorb thermomechanical stresses by virtue of its plastic deformation.

Further preferably, the first and also second solder layer are formed by forming a solder material between the mounting carrier and the connecting carrier. Forming the solder material includes, e.g., immersing and coating steps. Reliable production of a solder contact between the mounting carrier and the connecting carrier is simplified as a result.

Preferably, a flux is used when temporarily fixing the position of the mounting carrier on the connecting carrier. The use of the flux promotes the formation of a stable solder contact. The flux serves to remove any oxides present from the solder surface and the solder and prevents oxides from being newly formed. The flux also assists temporary fixing and is used at least at the connection points provided for the solder connection.

Preferably, the solder connection is produced between the structure and the connecting carrier by melting the solder material in a furnace process. Alternatively, the solder connection can be produced by melting the solder material in a thermocompression step.

Preferably during production of the solder connection hollow, spaces are formed between the mounting carrier and the connecting carrier. After production of the solder connection, the hollow spaces can be filled at least partially with a filler material.

The filler material is preferably an elastic and temperature-resistant synthetic material. Metals having a high ductility and a high thermal conductivity are likewise suitable as the filler material. The filler material increases the stability of the columnar structural elements, improves heat dissipation into the mounting body and at the same time increases the efficiency of the mounting carrier in terms of compensating for the thermomechanical stresses.

Further advantages and preferred examples of the mounting carrier and of the method will be apparent from the explanations hereinafter in conjunction with FIGS. 1 to 9.

Identical or similar elements, or elements acting in an identical manner, are provided with the same reference numerals in the figures. In each case, the figures are schematic views and are therefore not necessarily to scale. Rather, comparatively small elements, and in particular layer thicknesses, may be illustrated excessively large for clarification purposes.

A first example of a mounting carrier for semiconductor chips is illustrated in FIG. 1A schematically in a sectional view. The mounting carrier 1 comprises a first main surface 101 and a second main surface 102 which delimit the mounting carrier on a rear side or on a front side respectively. The second main surface 102 is flat. The first main surface 101 comprises a structure 5 having a plurality of columnar structural elements 41.

The mounting carrier 1 also comprises a mounting body 3 arranged between a first metallization 4 and a second metallization 2. The first metallization 4 is located on the rear side of the mounting carrier, wherein a boundary surface 103 of the mounting body separates the first metallization 4 from the mounting body 3. The first boundary surface 103 is formed in a planar manner. A structuring of the mounting body is thus not required to form the columnar structural elements.

The first metallization 4 in FIG. 1A comprises structural elements 41. The structural elements are arranged next to one another in the lateral direction. Formed between the structural elements 41 and the mounting body 3 is a structural base 42 which is likewise part of the first metallization 4. The structural base 42 directly adjoins the boundary surface 103.

The structural elements 41 are the same height. The height is preferably 30 micrometers to 300 micrometers. Moreover, the structural elements are located at the same distance from the second main surface 102. Furthermore, they are each arranged at an identical distance from one another.

On the side remote from the mounting body 3, the structural elements 41 form a common, flat connection plane which extends in particular in parallel with the second main surface 102.

The structural elements 41 comprise a cross-section extending in parallel with the second main surface 102. The cross-section is preferably circular. Preferably, the cross-section comprises a maximum extension of 20 micrometers to 3000 micrometers. The cross-section of the structural elements is constant along a direction extending perpendicularly to the first main surface 101.

A total surface of all of the cross-sectional surfaces of the structural elements is preferably 25% to 80% of the total surface of the second main surface 102.

The aspect ratio is 0.01 to 20, preferably 0.1 to 10 and particularly preferably 0.25 to 5. Such dimensions for the columnar structural elements have been found to be particularly suitable in terms of mechanical stability.

The mounting body preferably contains a ceramic, in particular an AlN ceramic. AlN is characterized by high thermal conductivity. Alternatively, another material can also be used, e.g., an aluminium oxide ceramic.

The metallization is preferably deposited on the mounting body 3. Preferably, it contains or consists of copper.

By reason of the columnar structural elements 41, the described mounting carrier 1 is characterized by its ability to be connected in a particularly reliable manner to a connecting carrier, for instance a printed circuit board. In particular, a thermally effectively conductive connection can be produced by a solder. The risk of a connection becoming broken by reason of thermomechanical stresses in the event of changes in temperature can be avoided or at least reduced by the multiplicity of columnar structural elements.

As a departure from the example described, the boundary surface 103 does not have to be flat. It can comprise, e.g., elevations and/or recesses. The mounting body itself can thus be structured. In particular, the columnar structural elements 41 can be formed at least partially by the structured mounting body. In this case, the first metallization 4 can be a metal layer which is arranged only on the apexes of the elevations of the mounting body. Alternatively, the metal layer can completely cover the elevations and also the recesses. The structural elements 41 thus comprise a part of the mounting body 3 and also a part of the first metallization 4.

The cross-section of the individual structural elements can also comprise a basic shape which deviates from a circular shape, e.g., a curved, for instance oval, or polygonal, for instance square, in particular rectangular, or hexagonal basic shape.

Furthermore, the cross-section of the individual structural elements does not necessarily have to be constant along the height. Preferably, a ratio of a minimum cross-section to a maximum cross-section of the same structural element is 0.5 to 1, particularly preferably 0.9 to 1.

Furthermore, the first metallization 4 does not necessarily have to comprise a structural base 42. In this case, the intermediate spaces between the structural elements 41 can extend to the boundary surface 103. In a flat boundary surface, the height of the structural elements corresponds to the thickness of the first metallization 4.

Figure 1B:
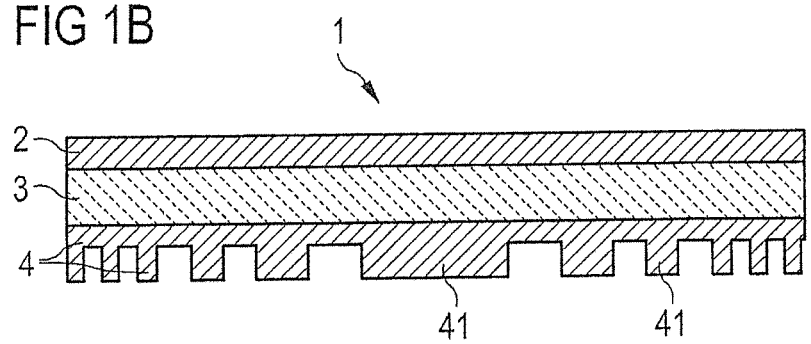
FIG. 1B shows a further example of a mounting carrier in a schematic sectional view.

FIG. 1B schematically illustrates in a sectional view a further example of a mounting carrier for semiconductor chips. This example corresponds substantially to the first example of the mounting carrier in FIG. 1A. In contrast thereto, at least two structural elements comprise mutually different cross-sections. The cross-sectional surfaces of the columnar structural elements 41 at edges of the first metallization 4 are smaller than the cross-sectional surfaces of the columnar structural elements 41 in an inner region of the first metallization 4. The different cross-sections can thereby assume different shapes.

From the inner region towards the edges of the first metallization, the columnar structural elements comprise cross-sectional surfaces which decrease in size. Such a distribution of the columnar structural elements having different cross-sections increases the stability of the connection between the mounting carrier and the connecting carrier in particular with respect to considerable fluctuations in temperature. The structure 5 comprises a symmetrical shape which contains a columnar structural element 41 having the largest cross-sectional surface in the center of the first metallization 4. Therefore, heat dissipation can be configured even more efficiently. Apart from this, it is also feasible for the structure to comprise a different symmetrical shape or an irregular shape.

With respect to the mounting carrier 1, in the examples and further figures reference is made only to FIG. 1A for reasons of clarity. The mounting carrier illustrated in FIG. 1B can also be used in the following examples.

Figure 2:
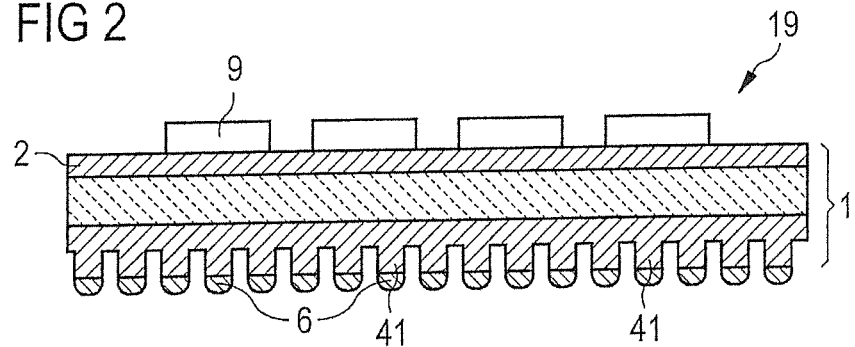
FIG. 2 shows an example of a semiconductor device having a mounting carrier in a schematic sectional view.

FIG. 2 illustrates in a schematic sectional view an example of a semiconductor device 19 having a mounting carrier 1 and semiconductor chips 9.

The mounting carrier 1 of this example corresponds substantially to the example of a mounting carrier described in conjunction with FIG. 1A. In contrast thereto, in this example a first solder layer 6 is formed on the structural elements 41. The semiconductor device 19 is preferably an optoelectronic semiconductor device.

For example, the first solder layer 6 contains SnAgCu. In FIG. 2, the first solder layer 6 forms a dome shape on each structural element 41. The dome shape covers a previously freely accessible cross-section of a structural element at least partially, preferably completely. In particular, the dome shape is of a height which is less than the minimum distance from the structural element bearing this dome shape to its adjacent structural elements.

The semiconductor device in FIG. 2 comprises a plurality of semiconductor chips 9 which are arranged on the second main surface 102 of the mounting carrier 1. The semiconductor chips 9 are, e.g., optoelectronic devices which are provided for generating electromagnetic radiation. The semiconductor chips directly connect to the second metallization 2 preferably with the aid of a connector, for instance a solder or an adhesive layer or a sinter layer. The melting point of the connection means is preferably higher than the melting point of the material of the first solder layer 6. The risk that the semiconductor chips will become detached from the mounting carrier during mounting of the mounting carrier is thus avoided.

A first example of a method of mounting a mounting carrier 1 on a connecting carrier 7 is illustrated in FIGS. 3A to 3D in schematic sectional views which describe four different method stages. The mounting carrier 1 corresponds by way of example to the mounting carrier in the example described in conjunction with FIG. 1A and comprises a first solder layer 6.

The connecting carrier can be, e.g., a printed circuit board (PCB) or a metal core printed circuit board (MCPCB).

Figure 3A:
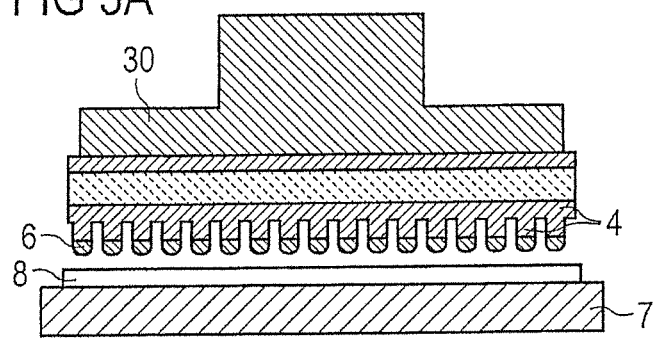
FIGS. 3A to 3D show schematic sectional views of various method stages of a first example of a method of mounting a mounting carrier.

In FIG. 3A, the mounting carrier 1 is provided, on the side facing the second main surface 102, preferably on a gripper arm 30 such that the structure comprising a plurality of columnar structural elements is freely accessible. The gripper arm 30 can be, e.g., a bond head.

A flux 8 is preferably applied onto a large area of the connecting carrier 7. The connecting carrier 7 comprises a connection surface which is at least exactly as large as the second main surface 102.

Figure 3B:
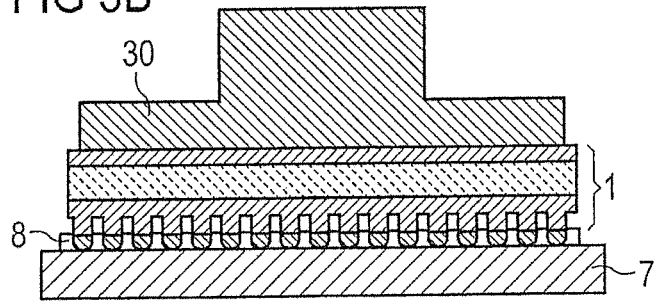

In the step illustrated in FIG. 3B, the mounting carrier 1 is placed on the connecting carrier 7 by the gripper arm 30. The first solder layer 6 is preferably completely enclosed by the flux 8.

Figure 3C:
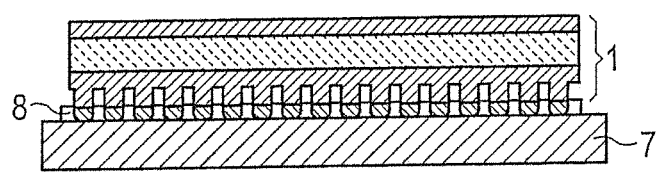

Subsequently, as illustrated in FIG. 3C, the gripper arm 30 is removed. The flux 8 assists temporary fixing of the position of the mounting carrier 1 on the connecting carrier 7.

Figure 3D:
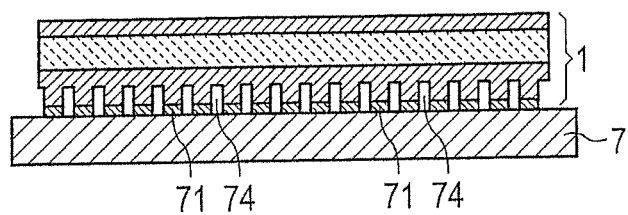

As shown in FIG. 3D, a solder material of the solder layer 6 is melted at temperatures above a melting temperature of the solder material in a furnace process. After cooling, a mechanically stable and thermally conductive solder connection is provided between the mounting carrier 1 and the connecting carrier 7. Instead of a solder connection provided over a large area, the columnar structural elements 41 permit formation of many separate connection points 71. Moreover, hollow spaces 74 are formed between the mounting carrier and the connecting carrier.

Figure 4A:
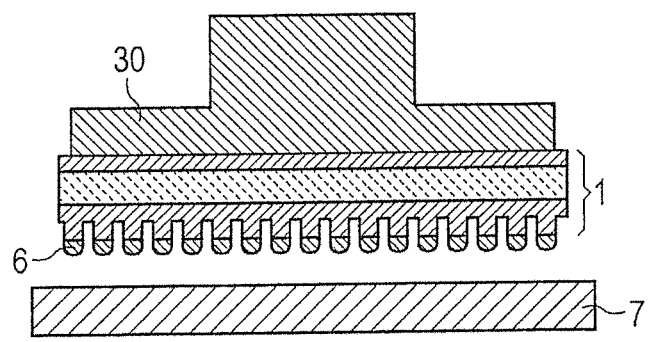
FIGS. 4A to 4C show schematic sectional views of various method stages of a second example of a method of mounting a mounting carrier.
Figure 4B:
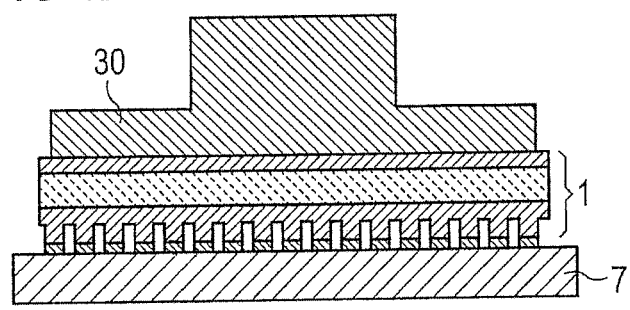
Figure 4C:
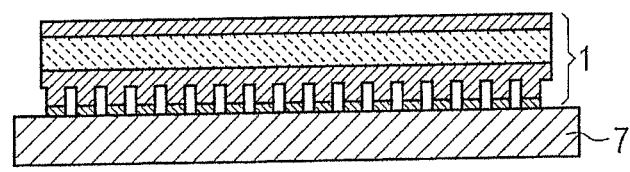
Figure 5A:
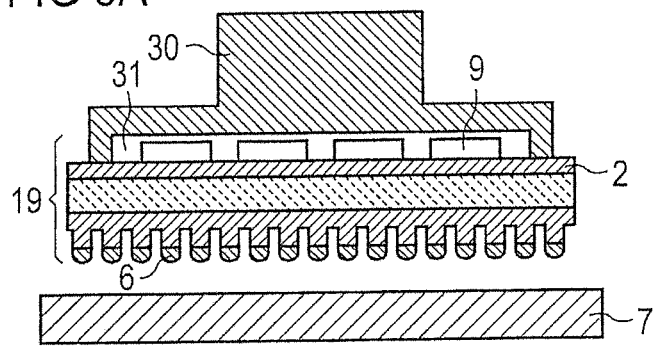
FIGS. 5A to 5D show schematic sectional views of various method stages of a third example of a method of mounting a semiconductor device.
Figure 5B:
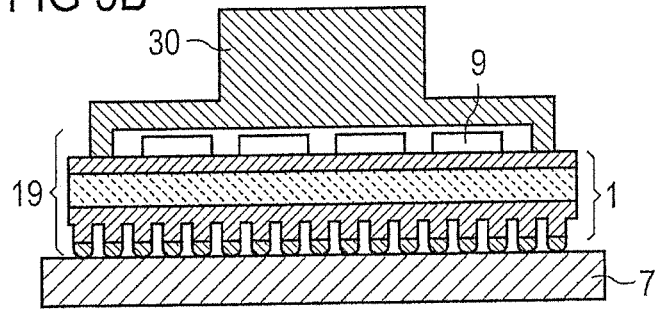
Figure 5C:
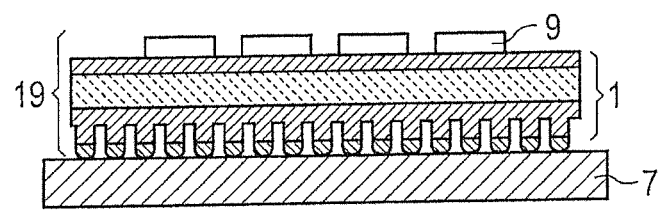
Figure 5D:
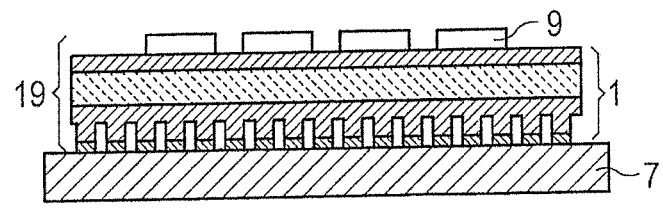

A second example of a method of mounting the mounting carrier 1 is illustrated in FIG. 4A to 4C in schematic sectional views which describe three different method stages.

This example corresponds substantially to the first example of the method. In contrast thereto, in this example the solder connection is produced by melting the solder material in a thermocompression step (FIG. 4B). The thermocompression step is performed even before removal of the gripper arm 30. The furnace process is not required in this example.

In comparison to the furnace process, the thermocompression step is particularly suitable for mounting the mounting carrier having semiconductor chips attached thereto, as the semiconductor chips are not directly exposed to the high temperatures.

In FIGS. 5A to 5D, a third example shows four different method stages of mounting a semiconductor device 19 of FIG. 2 on a connecting carrier 7. This example corresponds substantially to the first example of the method. In contrast thereto, semiconductor chips 9 are applied onto the second metallization 2 of the mounting carrier 1 prior to mounting of the semiconductor device 19. The semiconductor chips connect to the second main surface 102 with the aid of a connector, wherein the melting point of the connector is higher than the melting point of the solder material of the solder layer 6. Moreover, the gripper arm 30 comprises a cut-out 31 which is provided for protecting the semiconductor chips 9.

Figure 6A:
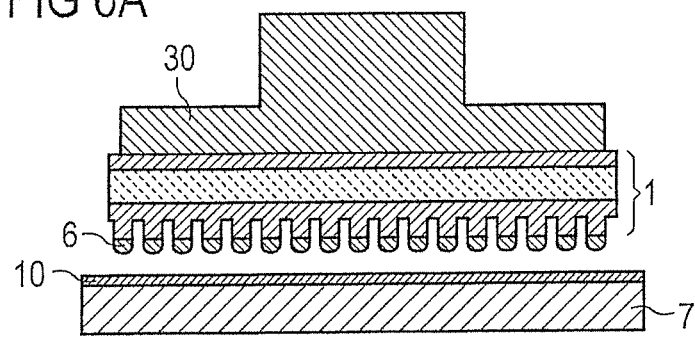
FIGS. 6A to 6D show schematic sectional views of various method stages of a fourth example of a method of mounting a mounting carrier.
Figure 6B:
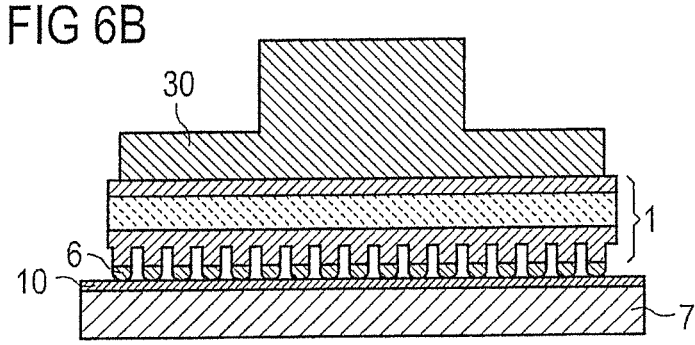
Figure 6C:
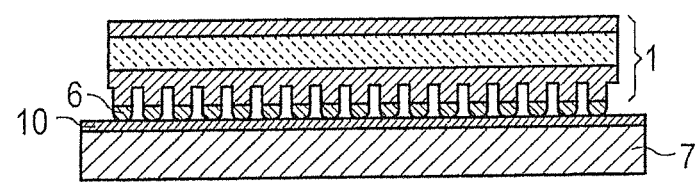
Figure 6D:
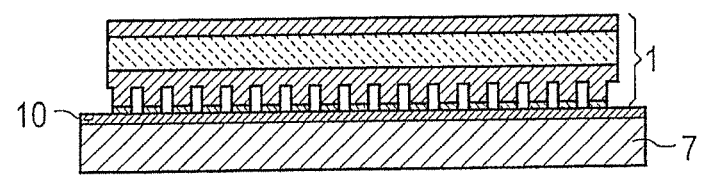

A fourth example of a method of mounting the mounting carrier 1 is illustrated in FIGS. 6A to 6D in schematic sectional views which describe four different mounting method stages. This example corresponds substantially to the first example of the method. In contrast thereto, in a coating step a second solder layer 10 is formed, in addition to the first solder layer 6, on a large area of the connecting carrier 7 (FIG. 6A). The connection between the mounting carrier 1 and the connecting carrier 7 is produced such that a plurality of connection points 71 and hollow spaces 74 are formed.

Figure 7A:
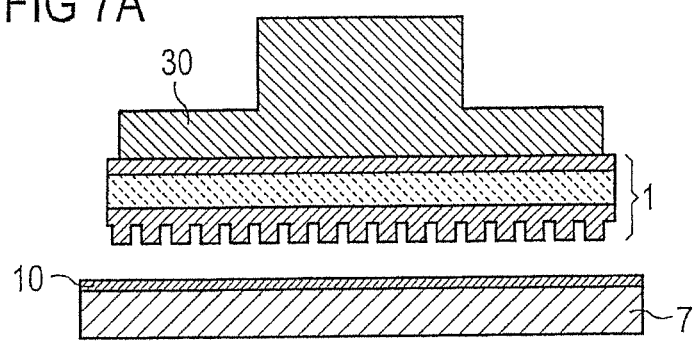
FIGS. 7A to 7D show schematic sectional views of various method stages of a fifth example of a method of mounting a mounting carrier.
Figure 7B:
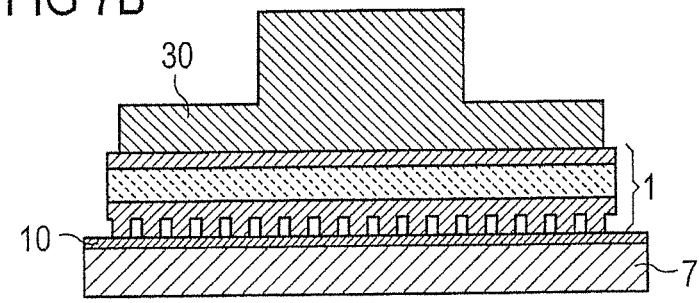
Figure 7C:
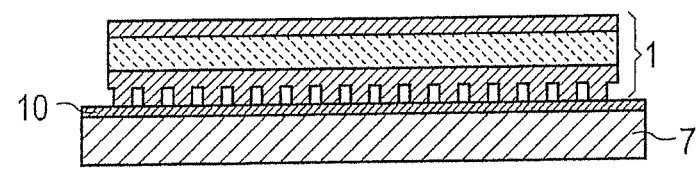
Figure 7D:
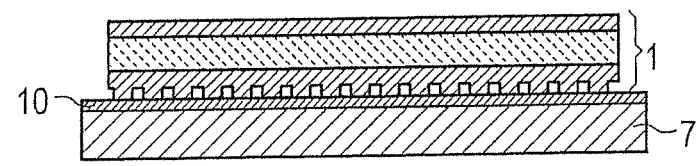

A fifth example describes a method of mounting a mounting carrier of FIG. 1A on the connecting carrier 7. FIGS. 7A to 7D illustrate four different mounting method stages. This example corresponds substantially to the fourth example of the method. In contrast thereto, the mounting carrier 1 in FIG. 7A is free of the first solder layer 6.

Figure 8A:
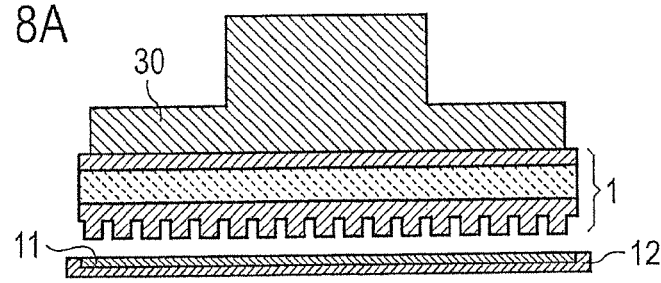
FIGS. 8A to 8E show schematic sectional views of various method stages of a sixth example of a method of mounting a mounting carrier.
Figure 8B:
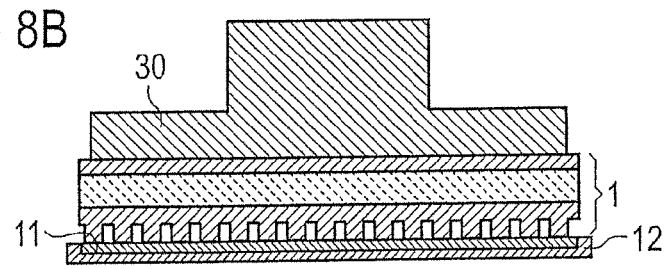
Figure 8C:
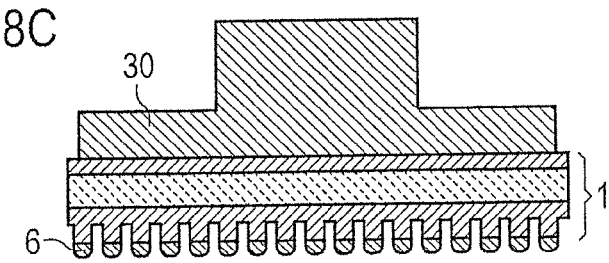
Figure 8D:
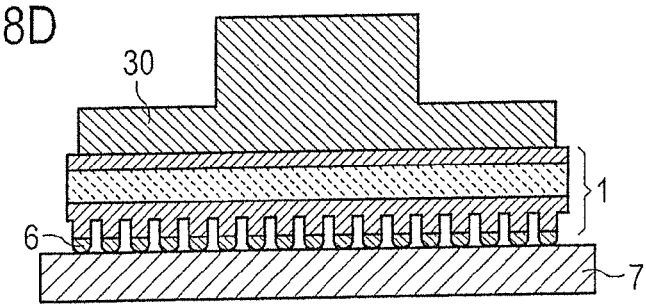
Figure 8E:
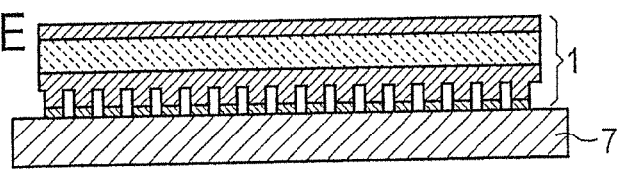

A sixth example describes a method of mounting the mounting carrier of FIG. 1A on a connecting carrier 7. FIGS. 8A to 8E illustrate five different mounting method stages. This example corresponds substantially to the first example of the method. In contrast thereto, initially the first solder layer 6 is formed by an immersing step (FIG. 8B). The mounting carrier 1 is guided into a reservoir 12 which is filled with a solder material 11 such that the solder material 11 adheres to the apexes of the columnar structural elements 41 and thus forms the first solder layer 6.

Figure 9A:
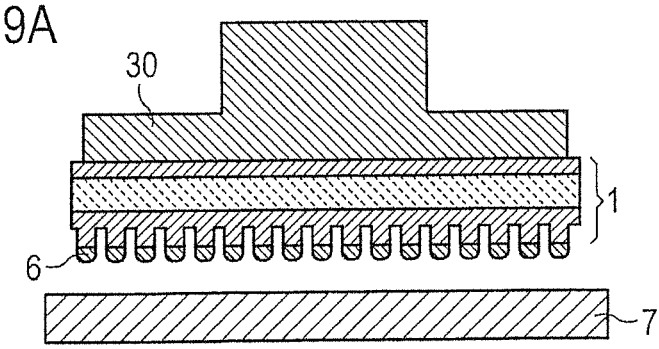
FIGS. 9A to 9E show schematic sectional views of various method stages of a seventh example of a method of mounting a mounting carrier.
Figure 9B:
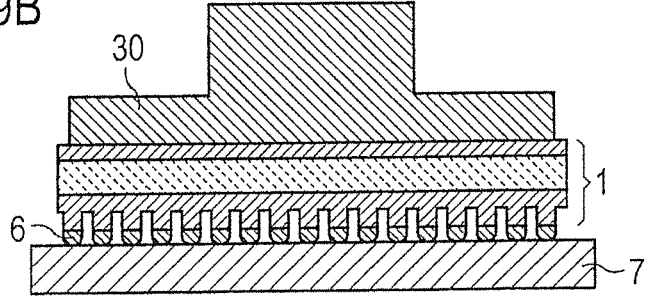
Figure 9C:
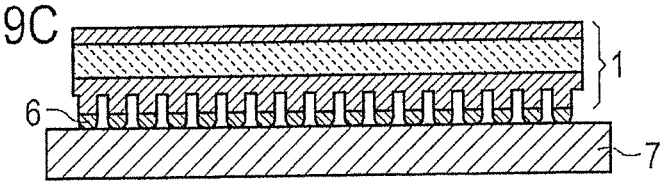
Figure 9D:
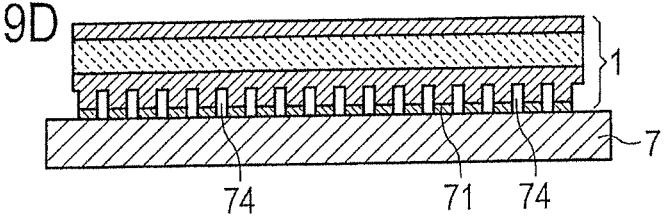
Figure 9E:
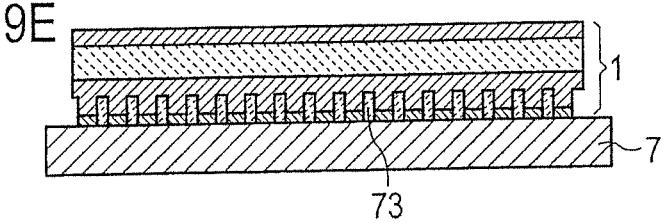

A seventh example describes a method of mounting a mounting carrier 1 on a connecting carrier 7. FIGS. 9A to 9E illustrate five different mounting method stages. This example represents an extension of the method which can be used in all of the above-described examples of the method. In this extension, the hollow spaces 74, produced during production of the solder connection, between the mounting carrier 1 and the connecting carrier 7 are filled with a filler material 13, as illustrated in FIG. 9E.

The filler material is preferably an elastic and temperature-resistant synthetic material. Preferably, the synthetic material is filled with a filler substance which increases the thermal conductivity. For example, the filler substance which increases the thermal conductivity contains metal particles and/or metal oxides, in particular $SiO_2$ particles. Metals with a high ductility and a high thermal conductivity are likewise suitable as the filler material. The surface, via which heat produced during operation of the semiconductor device 19 can be dissipated from the mounting carrier into the connecting carrier 7 is enlarged by the filler material.

Our carriers and methods are not limited to the examples by the description using the examples. Rather, this disclosure includes any new feature and any combination of features, what includes in particular any combination of features in the appended claims, even if the feature or combination itself is not explicitly stated in the claims or examples.

The invention claimed is:
1. A mounting carrier comprising:
a second main surface provided for mounting of semiconductor chips,
a first main surface opposite the second main surface, and
a mounting body comprising a first metallization on a side facing the first main surface, wherein
the first main surface comprises a structure having a plurality of columnar structural elements,
all of the structural elements are of the same height so that a common, flat connection plane of the mounting carrier extends parallel to the second main surface,
from an inner region towards edges of the first metallization the columnar structural elements comprise cross-sectional surfaces which decrease in size,
a connection face of the mounting carrier is divided into multiple connection points by the columnar structure so that thermomechanical stresses that occur in the event of fluctuations in temperature are compensated for, and a structural base is formed between the structural elements and the mounting body, the structural base completely covers the mounting body and is a part of the first metallization so that intermediate spaces between the structural elements extend in a vertical direction to the structural base and, when a voltage is applied, the structural base and all of the structural elements electrically connect to one another.

2. The mounting carrier according to claim 1, wherein the mounting body contains a ceramic.

3. The mounting carrier according to claim 1, wherein the structural elements comprise a height of 30 micrometers to 300 micrometers.

4. The mounting carrier according to claim 1, wherein a cross-section of the structural elements comprises a maximum extension of 20 micrometers to 3000 micrometers.

5. The mounting carrier according to claim 1, wherein an entire surface of all maximum cross-sections of the structural elements constitutes 25% to 80% of the entire surface of the second main surface.

6. The mounting carrier according to claim 1, wherein the mounting body comprises a second metallization on a side facing the second main surface.

7. The mounting carrier according to claim 1, wherein the structural elements are covered by a first solder layer.

8. The mounting carrier according to claim 7, wherein the first solder layer of the structural elements forms a dome shape, the height of which is less than a minimum distance from the structural element bearing the dome shape to its adjacent structural elements.

9. A method of mounting a mounting carrier according to claim 1 on a connecting carrier, comprising:
providing the mounting carrier,
forming a solder material between the mounting carrier and the connecting carrier,
temporarily fixing the position of the mounting carrier on the connecting carrier, and
producing a solder connection between the structure and the connecting carrier.

10. The method according to claim 9, wherein an application of the solder material comprises a step of immersing the structure into a reservoir, which is filled with the solder material, for forming a first solder layer.

11. The method according to claim 9, wherein an application of the solder material comprises a coating step that forms a second solder layer, in which at least connection points, which are provided for the solder connection, on the connecting carrier are coated with the solder material.

12. The method according claim 9, wherein production of the solder connection between the structure and the connecting carrier is effected by melting the solder material in a furnace process.

13. The method according to claim 9, wherein production of the solder connection between the structure and the connecting carrier is effected by melting the solder material in a thermocompression step.

14. The method according to claim 9, wherein hollow spaces which after production of the solder connection are at least partially filled with a filler material and are formed between the mounting carrier and the connecting carrier.

15. The mounting carrier according to claim 1, further comprising a ceramic, wherein the mounting body comprises a second metallization on the side facing the second main surface.

16. A mounting carrier comprising:
a second main surface provided for mounting of semiconductor chips,
a first main surface opposite the second main surface, and
a mounting body containing a ceramic and comprising a first metallization on a side facing the first main surface, wherein the first main surface comprises a structure having a plurality of columnar structural elements,
from an inner region towards edges of the first metallization the columnar structural elements comprise cross-sectional surfaces which decrease in size,
wherein the structural elements are covered by a first solder layer,
a connection face of the mounting carrier is divided into multiple connection points by reason of the columnar structure so that thermomechanical stresses that occur in the event of fluctuations in temperature are compensated for,
the mounting carrier is structured such that a boundary surface comprises a columnar structure, the structural elements are part of the metallization and the mounting carrier,
the first metallization is a metal layer arranged on and limited to apexes of the elevations of the boundary surface.

17. Arrangement comprising:
a connecting carrier which is a printed circuit board, and
a mounting carrier,
wherein
the mounting carrier has a flat second main surface,
a plurality of semiconductor chips is mounted on the second main surface,
the second main surface is formed of a second metallization,
the mounting carrier has a first main surface opposite the second main surface,
the mounting carrier has a mounting body containing a ceramic and comprising a first metallization on a side facing the first main surface,
the first main surface comprises a structure having a plurality of columnar structural elements, all of the structural elements are of the same height so that a common, flat connection plane of the mounting carrier extends parallel to the second main surface, the connection plane faces the connecting carrier,
tops of the structural elements facing away from the semiconductor chips are covered by a first solder layer,
the mounting carrier is attached to the connecting carrier by the first solder layer to a second solder layer at the mounting carrier so that a connection between the mounting carrier and the connecting carrier is produced such that a plurality of connection points and hollow spaces are formed,
the connection plane is divided into multiple connection points by the columnar structure so that thermomechanical stresses that occur in the event of fluctuations in temperature are compensated for,
the semiconductor chips connect to the second metallization with the aid of a connector, and
a melting point of the connector is higher than a melting point of the solder material of the first solder layer.

* * * * *